(12) United States Patent
Leobandung (10) Patent No.: US 10,957,665 B2
(45) Date of Patent: Mar. 23, 2021

(54) DIRECT C4 TO C4 BONDING WITHOUT SUBSTRATE

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 52 days.

(21) Appl. No.: 15/874,997

(22) Filed: Jan. 19, 2018

(65) Prior Publication Data

US 2019/0229080 A1 Jul. 25, 2019

(51) Int. Cl.
*H01L 23/00* (2006.01)
*H01L 23/522* (2006.01)
(Continued)

(52) U.S. Cl.
CPC .......... *H01L 24/11* (2013.01); *H01L 23/5226* (2013.01); *H01L 24/17* (2013.01); *H01L 24/81* (2013.01); *H01L 25/0657* (2013.01); *H01L 25/167* (2013.01); *H01L 24/09* (2013.01); *H01L 24/16* (2013.01); *H01L 24/32* (2013.01); *H01L 24/83* (2013.01); *H01L 2224/16147* (2013.01);
(Continued)

(58) Field of Classification Search
CPC ................. H01L 23/5226; H01L 24/81; H01L 2224/08146; H01L 2224/02372; H01L 21/187; H01L 2224/81894–81896; H01L 2224/83894–83896; H01L 25/043; H01L 25/0657; H01L 25/074; H01L 25/0756; H01L 25/117; H01L 23/522; H01L 2225/06513; H01L 2225/06541
See application file for complete search history.

(56) References Cited

U.S. PATENT DOCUMENTS 6,130,472 A * 10/2000 Feger .................... H01L 23/564
257/643
6,833,720 B1 * 12/2004 Daubenspeck ...... G01N 27/205
257/E23.002

(Continued)

OTHER PUBLICATIONS

Dang et al., "3D chip stacking with C4 technology," IBM Journal of Research and Development, vol. 52, No. 6, 2008, pp. 599-609.

(Continued)

*Primary Examiner* — Laura M Menz
*Assistant Examiner* — Khatib A Rahman
(74) *Attorney, Agent, or Firm* — Patterson + Sheridan, LLP (57) ABSTRACT

A method for manufacturing a 3D integrated circuit is provided. A manufacturing system provides a first integrated circuit having a first surface and a first via extending to the first surface. The manufacturing system applies a first controlled collapse chip connection (C4) solder bump to the first via. The manufacturing system provides a second integrated circuit having a second surface and a second via extending to the second surface. The manufacturing system applies a second C4 solder bump to the second via. The manufacturing system overturns the second integrated circuit onto the first integrated circuit and aligns the first C4 solder bump with the second C4 bump. The manufacturing system heats the first C4 solder bump and the second C4 solder bump until the first via contact is soldered to the second via.

22 Claims, 6 Drawing Sheets

(51) Int. Cl.
  *H01L 25/16* (2006.01)
  *H01L 25/065* (2006.01)
(52) U.S. Cl.
  CPC ........... *H01L 2224/32147* (2013.01); *H01L 2224/73203* (2013.01); *H01L 2224/81193* (2013.01); *H01L 2224/81815* (2013.01); *H01L 2224/94* (2013.01); *H01L 2224/97* (2013.01); *H01L 2225/06513* (2013.01); *H01L 2225/06541* (2013.01); *H01L 2924/35121* (2013.01)

(56) References Cited

U.S. PATENT DOCUMENTS

| | | | |
|---|---|---|---|
| 7,453,150 B1 | 11/2008 | McDonald | |
| 7,683,459 B2 | 3/2010 | Ma et al. | |
| 7,834,450 B2 | 11/2010 | Kang | |
| 8,476,771 B2 | 7/2013 | Scheuermann et al. | |
| 8,711,573 B2 | 4/2014 | Gillingham | |
| 9,443,814 B2 | 9/2016 | Yu et al. | |
| 2004/0012016 A1* | 1/2004 | Underwood | H01L 27/288 257/40 |
| 2004/0257847 A1* | 12/2004 | Matsui | G11C 7/1051 365/63 |
| 2006/0211167 A1* | 9/2006 | Knickerbocker | H01L 24/13 438/106 |
| 2006/0273455 A1* | 12/2006 | Williams | H01L 25/18 257/723 |
| 2008/0265435 A1* | 10/2008 | Charles | H01L 21/563 257/778 |
| 2009/0321948 A1 | 12/2009 | Wang et al. | |
| 2010/0096737 A1* | 4/2010 | Chua | H01L 25/105 257/686 |
| 2010/0237472 A1* | 9/2010 | Gillis | H01L 23/585 257/621 |
| 2010/0244276 A1* | 9/2010 | Burleson | H01L 24/17 257/777 |
| 2011/0076801 A1* | 3/2011 | Aoki | H01L 24/81 438/108 |
| 2011/0193197 A1* | 8/2011 | Farooq | H01L 23/585 257/618 |
| 2012/0314507 A1* | 12/2012 | Sakui | G11C 11/5628 365/185.28 |
| 2013/0084659 A1* | 4/2013 | Martens | H01L 22/14 438/14 |
| 2014/0038390 A1* | 2/2014 | Yang | H01L 23/585 438/462 |
| 2014/0061893 A1* | 3/2014 | Saeidi | H01L 21/52 257/712 |
| 2015/0037917 A1* | 2/2015 | Hori | H01L 33/405 438/29 |
| 2015/0155439 A1* | 6/2015 | Cich | H01L 33/32 362/294 |
| 2015/0178246 A1* | 6/2015 | Herrero Abellanas | G06F 17/153 708/300 |
| 2016/0049385 A1* | 2/2016 | Yu | H01L 24/19 257/774 |
| 2016/0336274 A1* | 11/2016 | Tang | H01L 21/76232 |

OTHER PUBLICATIONS

Maria et al., "3D Chip stacking with 50 ?m pitch lead-free micro-c4 interconnections," 61st Electronic Components and Technology Conference, ECTC, pp. 268-273.

* cited by examiner

DIRECT C4 TO C4 BONDING WITHOUT SUBSTRATE

BACKGROUND

The present invention relates to integrated circuits, and more specifically, to a method for joining a silicon-based integrated circuits (IC) to a non-silicon based (e.g. III-V-based) integrated circuit (IC), to form a three-dimensional integrated circuit (3D IC).

In microelectronics, a 3D IC is an integrated circuit manufactured by stacking silicon substrates and/or ICs and interconnecting them vertically using through-silicon vias (TSVs) so that they behave as a single device to achieve performance improvements at reduced power and smaller footprint than conventional two dimensional processes. 3D integrated circuits are just one of a host of 3D integration schemes that exploit the z-direction to achieve electrical performance benefits. 3D integrated circuits can be classified by their level of interconnect hierarchy at the global (package), intermediate (bond pad) and local (transistor) level. In general, 3D integration is a broad term that includes such technologies as 3D substrate-level packaging (3DWLP); 2.5D and 3D interposer-based integration; 3D stacked ICs (3D-SICs), monolithic 3D ICs; 3D heterogeneous integration; and 3D systems integration.

For 3D ICs that employ TSVs, a TSV structure is formed by deep etching into the substrate or the substrate, and filling the resulting hole with a liner, a diffusion barrier layer, and a conductive filling layer. The substrate is thinned from its backside, until the conductive filling layer is exposed, and a backside metal and bumps are deposited on the thinned backside for electrical contact. Accordingly, TSV structures require high reliability between batches for mass production. However, it is found that TSV structures suffer stress issue. Specifically, the stress at the interface of the TSV structures and other materials causes cracking and/or delamination after substrate back end of line (hereinafter abbreviated as BEOL) process. TSVs are also expensive and may be bulky.

Therefore, there is a need in the art for improved techniques for manufacturing a 3D IC.

SUMMARY

According to one embodiment of the present invention, a method for manufacturing a 3D integrated circuit is provided. A manufacturing system provides a first integrated circuit (IC) having a first surface and a first via extending to the first surface. The manufacturing system applies a first controlled collapse chip connection (C4) solder bump to the first via. The manufacturing system provides a second IC having a second surface and a second via extending to the second surface. The manufacturing system applies a second C4 solder bump to the second via. The manufacturing system overturns the second IC onto the first IC and aligns the first C4 solder bump with the second C4 bump. The manufacturing system heats the first C4 solder bump and the second C4 solder bump until the first via is soldered to the second via.

According to another embodiment of the present invention, another method for manufacturing a 3D integrated circuit is provided. A manufacturing system provides a first semiconductor substrate having a first surface and a first via extending to the first surface. The manufacturing system applies a first controlled collapse chip connection (C4) solder bump to the first via. The manufacturing system provides a second semiconductor substrate having a second surface and a second via extending to the second surface. The manufacturing system overturns the second substrate onto the first substrate and aligns the first C4 solder bump with the second via. The manufacturing system heats the first C4 solder bump until the first via is soldered to the second via.

According to another embodiment of the present invention, a 3D integrated circuit is provided. The 3D integrated circuit includes a first IC having a first surface and a first via extending to the first surface. The 3D integrated circuit further includes a second IC having a second surface and a second via extending to the second surface, wherein the first via is soldered to the second via, the first surface facing the second surface.

DETAILED DESCRIPTION

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

Aspects of the present disclosure provide a 3D integrated circuit and method of making same that comprises two integrated circuits or two integrated circuit substrates bonded together using controlled collapse chip connection (C4) to C4 bonding. One of the two integrated circuits may be manufactured using one manufacturing process on a silicon (Si) substrate for logic circuitry thereon (CPU, memory etc.). The other of the two integrated circuits may be manufactured using a second manufacturing process on a III-V semiconductor (e.g., GaAs, GaN) substrate for optical circuitry thereon (lasers, LEDs, photodetectors, etc.). The 3D integrated circuit does not require any external substrates to provide chip-to-chip connections. The 3D integrated circuit is small footprint, low cost device that may be embedded in Internet-of-Things (IoT) applications such as currency, the human body, etc.

Figure 1:
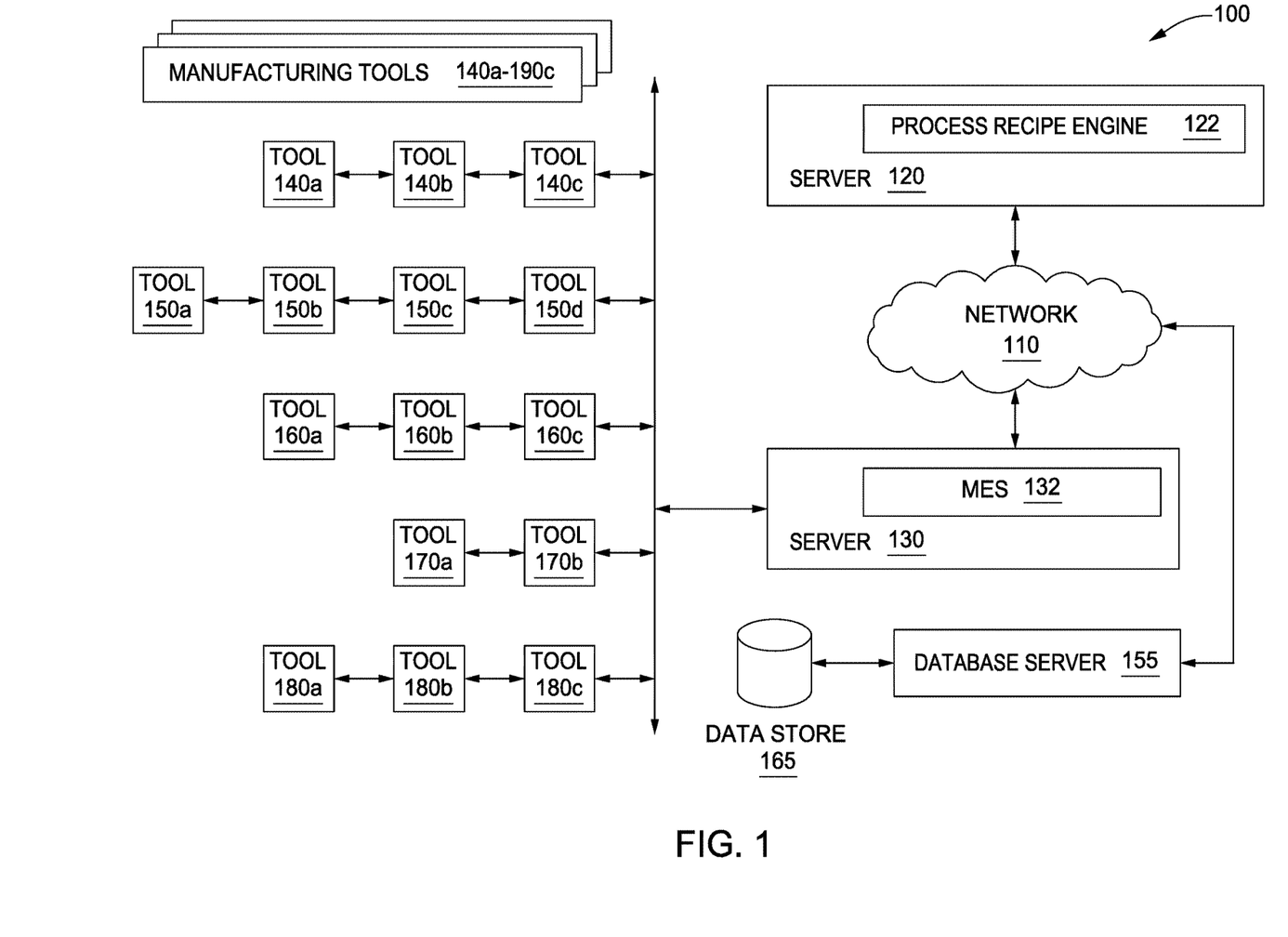
FIG. 1 depicts a manufacturing system in which embodiments of the present disclosure may be implemented.

FIG. 1 depicts a manufacturing system 100 in which embodiments of the present disclosure may be implemented. As shown, manufacturing system 100 includes a server 120 which is connected via network 110 to another server 130 which is connected to a plurality of manufacturing tools 140a-190c. Network 110 may, for example, comprise the Internet. In another embodiment, the manufacturing tools 140a-190c are also connected directly to server 120.

Server 120 may comprise a computing device such as a rack server, desktop or laptop computer, mobile phone, tablet, or other suitable computing device. As shown, the server 120 comprises a process recipe engine 122 which may perform operations described herein related to employing the manufacturing tools 140a-190c perform a plurality of processing steps on each of the two substrates comprising the 3D integrated circuit substrates. For example, process recipe engine 122 may analyze information received from a manufacturing execution system (MES) 132 of server 130 (e.g., chip design data, defect data, information about the manufacturing process, information about the manufacturing tools, and metrology data) in order to direct one set of the manufacturing tools (e.g., 140a-150d) to perform the processing recipe steps needed to manufacture the silicon-based electronic IC substrate discussed above, to direct a second set of the manufacturing tools (e.g., 160a-170b) to perform the processing recipe steps needed to manufacture the III-V-based opto-electronic IC substrate discussed above, and to direct a third set of the manufacturing tools (e.g., 180a-180c) to perform the processing recipe steps needed to bond the two substrates together using C4 bumps.

In some embodiments, the server 120 is separate from the manufacturing tools 140a-190c. In other embodiments, the server 120 may be part of the manufacturing tools 140a-190c or may be an off-line server.

Server 130 may comprise a computing device such as a rack server, desktop or laptop computer, mobile phone, tablet, or other suitable computing device. As shown, server 130 comprises the MES 132, which may perform operations described herein related to coordinate processes performed by the plurality of manufacturing tools 140a-190c, and may collect data from these tools (e.g., alignment data, chip design data, defect data, information about the manufacturing process, information about the parameters of the manufacturing tools 140a-190c, and metrology data). MES 132 may provide this information to process recipe engine 122 (e.g., over network 110), which may analyze the information and provide instructions for controlling the processing steps to manufacture the 3D integrated circuit.

Manufacturing tools 140a-190c may comprise one or more tools which perform processes related to manufacturing silicon substrates and III-V semiconductor substrates. For example, manufacturing tools 140a-190c may include lithography tools (e.g., including mechanical and optical alignment tools), etching tools, deposition tools, and planarization tools. Manufacturing tools 140a-190c may communicate with MES 132 in order to receive instructions and provide information about, for example, substrates, defects, parameters, and the manufacturing process.

The manufacturing system 100 is adapted to fabricate semiconductor devices. Although the subject matter is described as it may be implemented in a semiconductor fabrication facility, the application of the techniques described herein is not so limited and may be applied to other manufacturing environments. The techniques described herein may be applied to a variety of manufactured items including, but not limited to microprocessors, memory devices, digital signal processors, application specific integrated circuits (ASICs), or other similar devices. The techniques may also be applied to manufactured items other than semiconductor devices.

Each of the manufacturing tools 140a-190c are grouped into sets of tools of the same type, as denoted by lettered suffixes. For example, the set of manufacturing tools 140a-190c represent tools of a certain type, such as a photolithography stepper that are capable of performing the same process operation. In the case of manufacturing tools 140a-190c with multiple chambers, the lettered suffixes may represent multiple chambers of a single process tool. A particular substrate or lot of substrates progresses through the manufacturing tools 140a-190c as it is being manufactured, with each of the manufacturing tools 140a-190c performing a specific function in the process flow. Exemplary manufacturing tools for a semiconductor device fabrication environment, include metrology tools, photolithography steppers, etch tools, deposition tools, polishing tools, rapid thermal process tools, implantation tools, test equipment tools, etc. The manufacturing tools 140a-190c are illustrated in a rank and file grouping for illustrative purposes only. In an actual implementation, the manufacturing tools 140a-190c may be arranged in any order of grouping. Additionally, the connections between the tools in a particular grouping are meant to represent only connections to the network 110, rather than interconnections between the tools.

Although the manufacturing system 100 is described as it may be implemented for scheduling lots of manufactured items, it may also be used schedule individual manufactured items. The MES 132 of server 130 directs the high level operation of the manufacturing system 100. The MES 132 monitors the status of the various entities in the manufacturing system 100 (i.e., lots, the manufacturing tools 140a-190c and controls the flow of articles of manufacture (e.g., lots of semiconductor substrates) through the process flow. The MES 132 may also be referred to as a scheduling server. A database server 155 is provided for storing data related to the status of the various entities and articles of manufacture in the process flow. The database server 155 may store information in a data store 165. The data may include pre-process and post-process metrology data, tool trace data, lot priorities, etc. The distribution of the processing and data storage functions amongst the different servers in FIG. 1 is generally conducted to provide independence and central information storage. Of course, different numbers of servers and different arrangements may be used.

Figure 2:
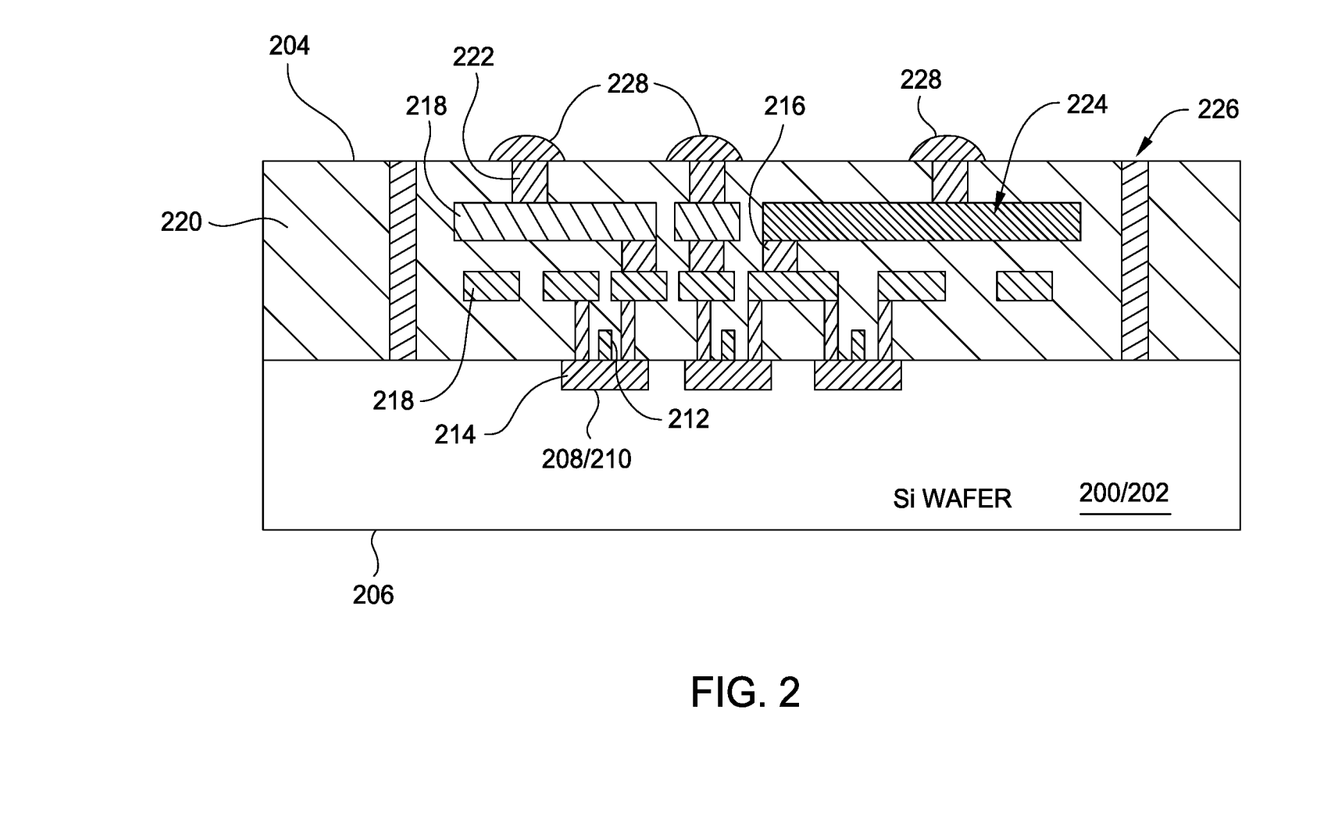
FIG. 2 illustrates a cross-sectional view of a silicon-based semiconductor device substrate comprising a plurality of ICs to be formed as part of a 3D integrated circuit.

FIG. 2 illustrates a cross-sectional view of a silicon-based semiconductor device substrate 200 comprising a plurality of ICs 202 to be formed as part of a 3D integrated circuit. The semiconductor device substrate 200/IC 202 has a first surface 204 and a second surface 206 underlying the first surface 204. The semiconductor device substrate 200/IC 202 may be made of a first semiconductor device material, which may be, for example p-type or n-type silicon. One or more active components 208 may be formed within the semiconductor device substrate 200/IC 202. The active components 208 may be, for example, a plurality of transistors 210 that comprise first circuitry comprising device logic. The transistors 210 may be, for example, field effect transistors having gates 212, and source regions and drain regions 214. A plurality of internal vias 216 and metallization layers 218 interconnect the active components 208 within the insulating regions 220. A second set of vias 222 extend from an uppermost metallization layer 218 to the first surface 204. Other electrical components, such as an RF antenna 224 or passive components (not shown) such as capacitors, inductors, resistors, and transformers may be formed between the internal vias 216 within the insulating regions 220. Each IC 202 within the substrate 200 may include a pair of crack stops and moisture barriers 226 formed about the metalization layers 218 and the vias 216, 222. A set of first controlled collapse chip connection (C4) solder bumps 228 may be applied to the vias 222 that extend to the first surface 204.

Figure 3:
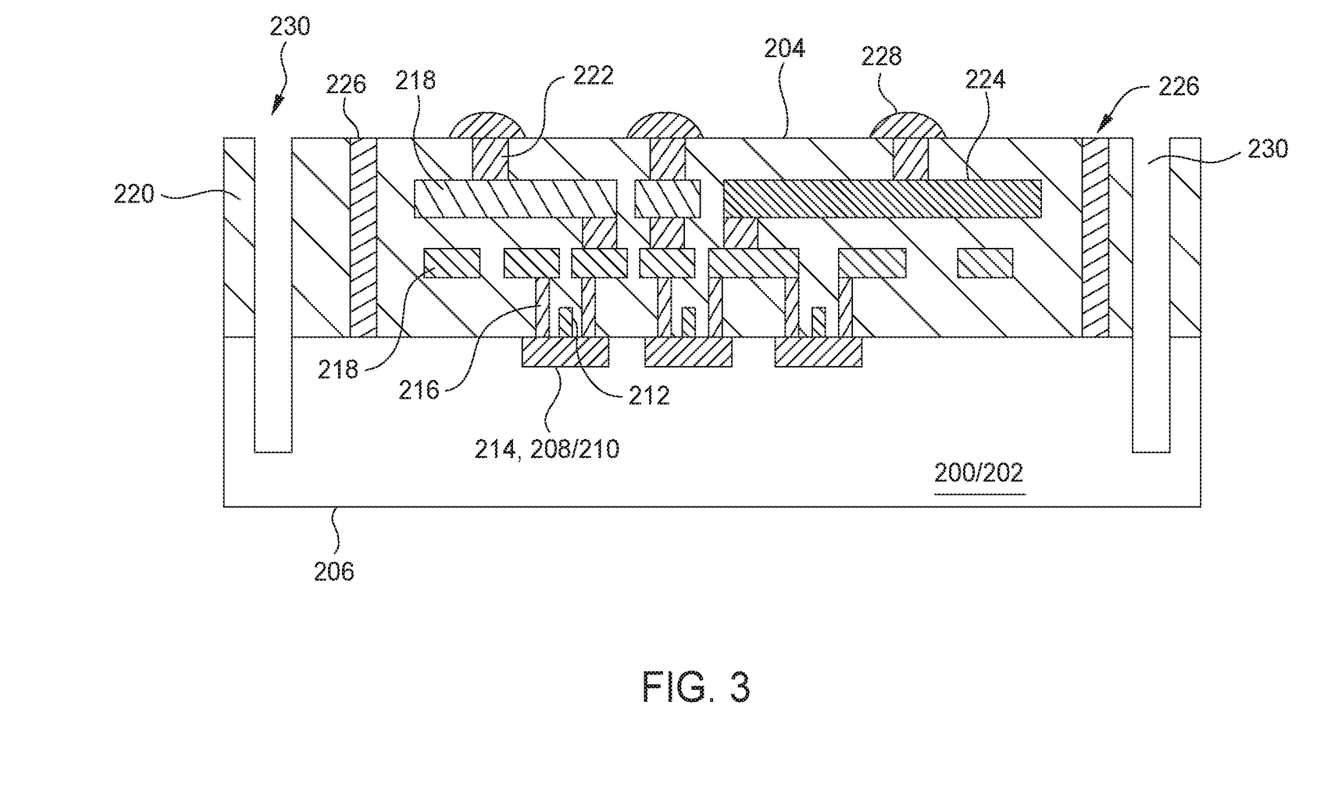
FIG. 3 illustrates a second cross-sectional view of the silicon-based semiconductor device substrate comprising the plurality of ICs.

FIG. 3 illustrates a second cross-sectional view of the silicon-based semiconductor device substrate 200 comprising the plurality of ICs 202. The manufacturing system 100 may direct one or more of the manufacturing tools 140a-190c to etch dicing channels 230 adjacent to the crack stops 226. The type of etching process may include one of RIE, wet etch, Ion Mills, etc.

Figure 4:
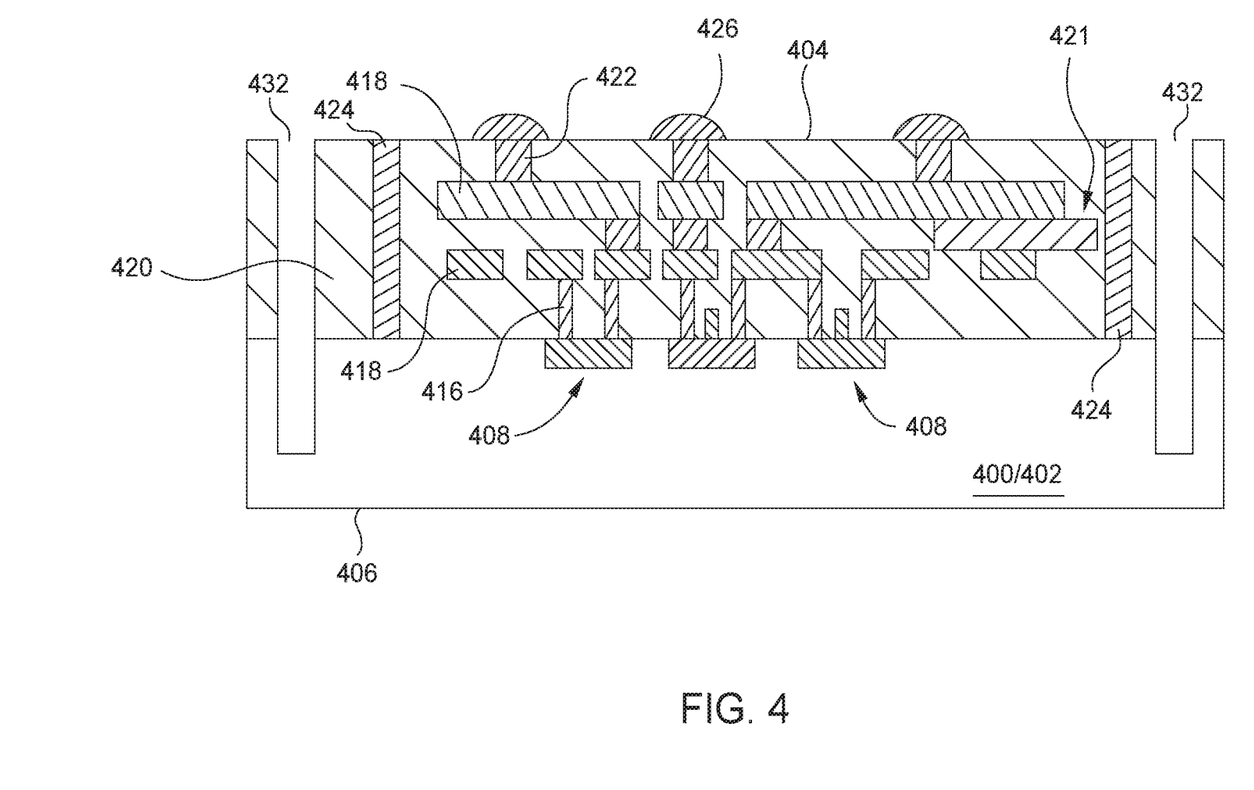
FIG. 4 illustrates a cross-sectional view of a III-V-based substrate comprising a plurality of integrated circuit ICs to be formed as part of the 3D integrated circuit.

FIG. 4 illustrates a cross-sectional view of a III-V-based substrate 400 comprising a plurality of ICs 402 to be formed as part of a 3D integrated circuit. The III-V-based substrate 400/IC 402 is made of a different semiconductor device material from the silicon-based semiconductor device substrate 200/IC 202 of FIG. 2. In an example, the second material may be p-type or n-type III-V semiconductor device material, such as gallium arsenide, gallium nitride, etc. The semiconductor device substrate 400/IC 402 may be fabricated using a number of steps and processes that are different from the fabrication process of the semiconductor device substrate 200/IC 202. The semiconductor device substrate 400/IC 402 has a first surface 404 and a second surface 406 underlying the first surface 404. One or more active components 408 may be formed within the semiconductor device substrate 400/IC 402. The active components 408 may be, for example, a plurality of optoelectronic devices or input/output devices, including laser diodes, photo detectors, LEDs, etc. A plurality of internal vias 416 and metallization layers 418 interconnect the active components 408 within the insulating regions 420. A second set of vias 422 extend from an uppermost metallization layer 418 to the first surface 404. Other electrical components, such as a battery 421 may be formed between the internal vias 416 within the insulating regions 420. Each IC 402 within the substrate 400 may include a pair of crack stops and moisture barriers 424 about the metallization layers 418 and the vias 416, 422. A set of controlled collapse chip connection (C4) solder bumps 426 may be applied to the vias 422 that extend to the first surface 404.

In one example, the IC 202 may include device functions/functionality that differs from the IC 402. In another example, the IC 202 comprises a first portion of first circuitry of a first one or more functionality and the IC 402 comprises second portion of first circuitry.

Figure 5:
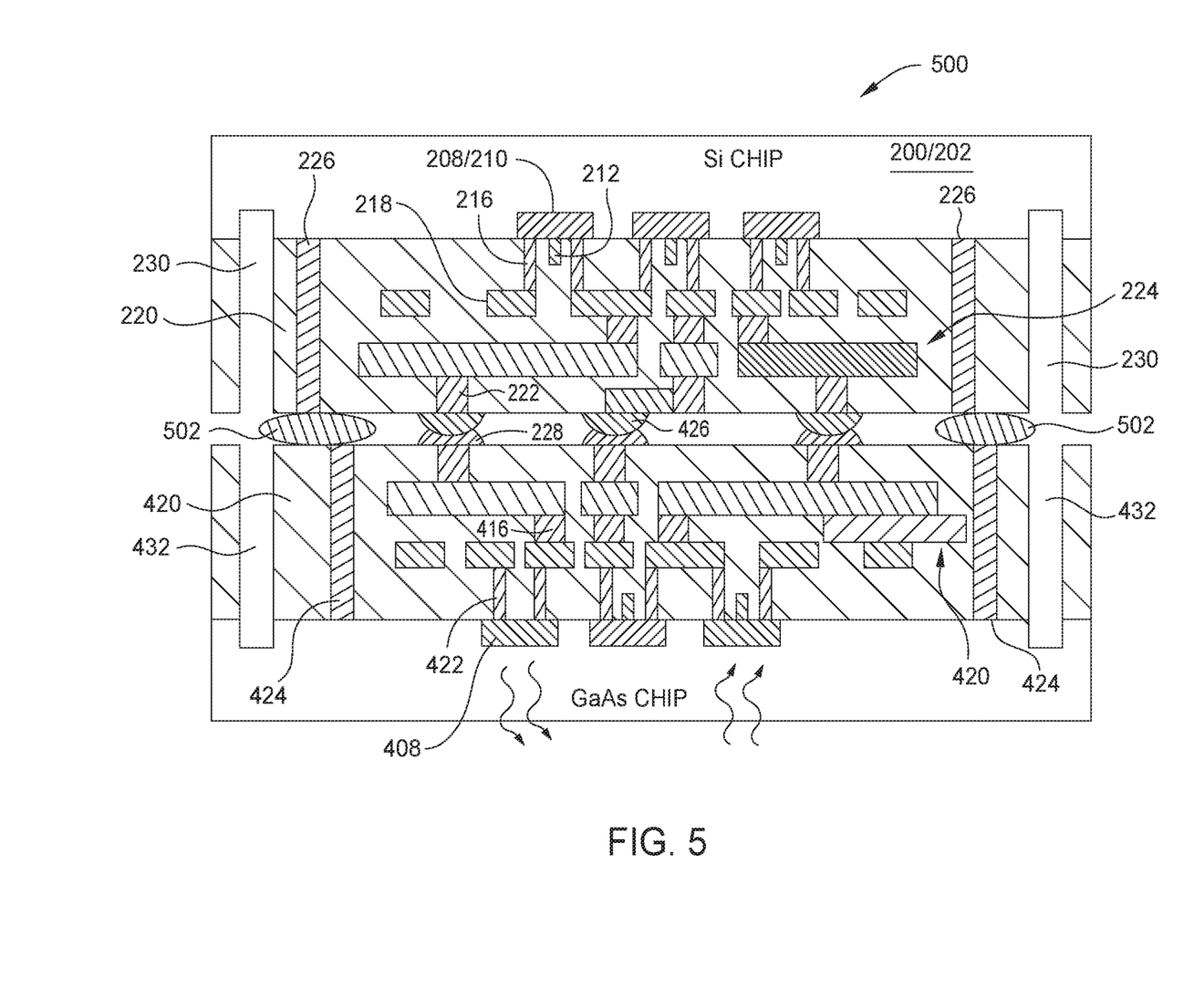
FIG. 5 illustrates a cross-sectional view of the fully manufactured 3D integrated circuit.

FIG. 5 illustrates a cross-sectional view of a fully manufactured 3D integrated circuit 500. To manufacture the 3D integrated circuit 500, the process recipe engine 122 of the manufacturing system 100 instructs one of the manufacturing tools 140a-190c to overturn the semiconductor device substrate 400/IC 402 onto the semiconductor device substrate 200/IC 202 and to align the C4 solder bumps 426 with the C4 solder bumps 228. The process recipe engine 122 of the manufacturing system 100 then instructs one of the manufacturing tools 140a-190c to heat the C4 solder bumps 426 and the C4 solder bumps 228 until they melt to form a solder joint joining the vias 422 to the vias 222. The process recipe engine 122 of the manufacturing system 100 then instructs one of the manufacturing tools 140a-190c to bond the IC 202 to the IC 402 with an adhesive material 502 overlying the one or more dicing channels 230 of the IC 202 and underlying one or more dicing channels 432 of the IC 402 aligned with the one or more dicing channels 230 of the IC 202. The bonding process may be performed at the wafer level or after dicing (i.e., die level). It may be less expensive to perform the bonding process at wafer level since hundred or thousand of dies may be bonded simultaneously. However, bonding at the wafer level is suitable for small dies.

Figure 6:
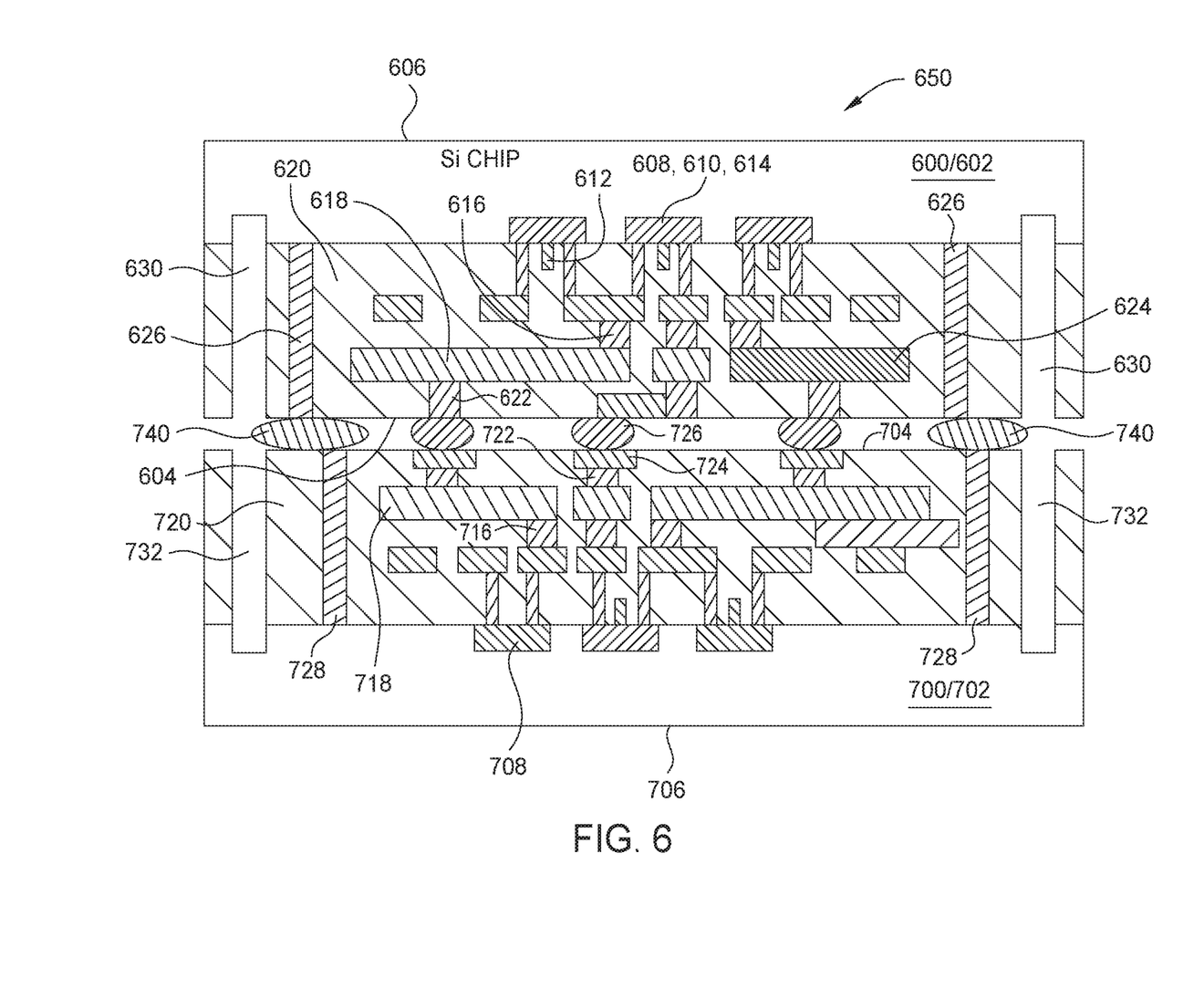
FIG. 6 shows a cross sectional view of another embodiment of the 3D integrated circuit.

FIG. 6 shows a cross sectional view of another embodiment of the 3D integrated circuit 650 having a silicon-based semiconductor device substrate 600/IC 602 overlying a III-V based semiconductor device substrate 700/IC 702. The Si-based semiconductor device substrate 600/IC 602 has a first surface 604 and a second surface 606 underlying the first surface 604. The semiconductor device substrate 600/IC 602 may be made of a first semiconductor device material, which may be, for example p-type or n-type silicon. One or more active components 608 may be formed within the semiconductor device substrate 600/IC 602. The active components 608 may be, for example, a plurality of transistors 610 that comprise first circuitry comprising device logic. The transistors 610 may be, for example, field effect transistors having gates 612, and source regions and drain regions 614. A plurality of internal vias 616 and metallization layers 618 interconnect the active components 608 within the insulating regions 620. A second set of vias 622 extend from an uppermost metallization layer 618 to the first surface 604. Other electrical components, such as an RF antenna 624 or passive components (not shown) such as capacitors, inductors, resistors, and transformers may be formed between the internal vias 616 within the insulating regions 620. Each IC 602 within the substrate 600 may include a pair of crack stops and moisture barriers 626 formed about the metalization layers 618 and the vias 616, 622. The bonding process may be performed at the wafer level or after dicing (i.e., die level). It may be less expensive to perform the bonding process at wafer level since hundred or thousand of dies may be bonded simultaneously. However, bonding at the wafer level is suitable for small dies.

The III-V-based semiconductor device substrate 700/IC 702 is made of a different semiconductor device material from the silicon-based semiconductor device substrate 600/IC 602. In an example, the second material may be p-type or n-type III-V semiconductor device material, such as gallium arsenide, gallium nitride, etc. The III-V-based semiconductor device substrate 700/IC 702 may be fabricated using a number of steps and processes that are different from the fabrication process of the silicon-based semiconductor device substrate 600/IC 600. The semiconductor device IC substrate 700/IC 702 has a first surface 704 and a second surface 706 underlying the first surface 704. One or more active components 708 may be formed within the semiconductor device substrate 700/IC 702. The active components 708 may be, for example, a plurality of optoelectronic devices or input/output devices, including laser diodes, photo detectors, LEDs, etc. A plurality of internal vias 716 and metallization layers 718 interconnect the active components 708 within the insulating regions 720. A second set of vias 722 extend from an uppermost metallization layer 718 to the first surface 704. A set of bond pads or pillars 724 rests overlying the vias 722. A set of C4 bumps 726 rests upon the bond pads or pillars 724. Other electrical components, such as a battery 720 may be formed between the internal vias 716 within the insulating regions 720. Each IC 702 within the substrate 700 may include a pair of crack stops and moisture barriers 728 about the metalization layers 718 and the vias 716, 722.

In one example, the IC 602 may include device functions/functionality that differs from the second IC 702. In another example, the IC 602 comprises a first portion of first circuitry of a first one or more functionality and the IC 702 comprises second portion of first circuitry.

To manufacture the 3D integrated circuit 700, the process recipe engine 122 of the manufacturing system 100 instructs one of the manufacturing tools 140a-190c to overturn the semiconductor device substrate 700/IC 702 onto the semiconductor device substrate 600/IC 602 and to align the C4 solder bumps 726 with the vias 622. The process recipe engine 122 of the manufacturing system 100 then instructs one of the manufacturing tools 140a-190c to heat the C4 solder bumps 726 until they melt to form a solder joint joining the vias 622 through the bond pads 724 to the vias 722. The process recipe engine 122 of the manufacturing system 100 then instructs one of the manufacturing tools 140a-190c to bond the IC 602 to the IC 702 with an adhesive material 740 overlying the one or more dicing channels 630 of the IC 602 and underlying one or more dicing channels 732 of the IC 702 aligned with the one or more dicing channels 630 of the IC 602.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present invention, other and further embodiments of the invention may be devised without departing from the basic scope thereof, and the scope thereof is determined by the claims that follow.

What is claimed is:

1. A method for manufacturing a three-dimensional (3D) integrated circuit, comprising:
   providing a first integrated circuit having a first surface and a first via extending to the first surface;
   applying a first controlled collapse chip connection (C4) solder bump to the first via;
   providing a second integrated circuit having a second surface and a second via extending to the second surface;
   forming a first crack stop or moisture barrier in the first integrated circuit that extends to the first surface;
   forming a second crack stop or moisture barrier in the second integrated circuit that extends to the second surface;
   forming a first dicing channel adjacent to the first crack stop or moisture barrier;
   forming a second dicing channel adjacent to the second crack stop or moisture barrier;
   applying a second C4 solder bump to the second via;
   overturning the second integrated circuit onto the first integrated circuit such that the first surface and the first C4 solder bump of the first integrated circuit are in a facing relationship with the second surface and the second C4 solder bump of the second integrated circuit, wherein the first C4 solder bump is aligned with and directly physically contacts the second C4 solder bump;
   heating the first C4 solder bump and the second C4 solder bump until the first C4 solder bump and the second C4 solder bump melt to form a solder joint joining the first via to the second via; and
   bonding the first integrated circuit to the second integrated circuit with an adhesive material overlaying the first dicing channel and underlying the second dicing channel aligned with the first dicing channel, wherein there is a gap between the solder joint and the adhesive material.

2. The method of claim 1, wherein the first integrated circuit is made of a first semiconductor material and the second integrated circuit is made of a second semiconductor device material different from the first semiconductor device material.

3. The method of claim 2, wherein the first semiconductor device material is silicon and the second semiconductor device material is a III-V semiconductor material.

4. The method of claim 1, wherein the first integrated circuit comprises first circuitry of a first one or more functionality and the second integrated circuit comprises second circuitry of a second one or more functionality different from the first one or more functionality.

5. The method of claim 4, wherein the first circuitry is device logic and the second circuitry is optoelectronic circuitry or input/output circuitry.

6. The method of claim 1, wherein the first integrated circuit comprises a first portion of first circuitry of a first one or more functionality and the second integrated circuit comprises second portion of first circuitry.

7. The method of claim 1, wherein the first dicing channel is etched using at least one of an RIE, wet etch, or Ion Mills process.

8. A method for manufacturing a three dimensional (3D) integrated circuit, comprising:
providing a first integrated circuit having a first surface and a first via extending to the first surface;
applying a controlled collapse chip connection (C4) solder bump to the first via;
providing a second integrated circuit having a second surface and a second via contacting an overlying bond pad that extends from the second surface;
forming a first crack stop or moisture barrier in the first integrated circuit that extends to the first surface;
forming a second crack stop or moisture barrier in the second integrated circuit that extends to the second surface;
forming a first dicing channel adjacent to the first crack stop or moisture barrier;
forming a second dicing channel adjacent to the second crack stop or moisture barrier;
overturning the second integrated circuit onto the first integrated circuit such that the first surface and the C4 solder bump of the first integrated circuit are in a facing relationship with the second surface and the bond pad of the second integrated circuit, wherein the C4 solder bump is aligned with and directly physically contacts the bond pad;
heating the C4 solder bump until the C4 solder bump melts to form a solder joint joining the first via to the bond pad; and
bonding the first integrated circuit to the second integrated circuit with an adhesive material overlaying the first dicing channel and underlying the second dicing channel aligned with the first dicing channel, wherein there is a gap between the solder joint and the adhesive material.

9. The method of claim 8, wherein the first integrated circuit is made of a first semiconductor material and the second integrated circuit is made of a second semiconductor device material different from the first semiconductor device material.

10. The method of claim 9, wherein the first semiconductor device material is silicon and the second semiconductor device material is a III-V semiconductor material.

11. The method of claim 8, wherein the first integrated circuit comprises one or more integrated circuits of first circuitry of a first one or more functionality and the second integrated circuit comprises one or more integrated circuits of second circuitry of a second one or more functionality different from the first one or more functionality.

12. The method of claim 11, wherein the first circuitry is device logic and the second circuitry is optoelectronic circuitry or input/output circuitry.

13. The method of claim 8, wherein the first integrated circuit comprises a first portion of first circuitry of a first one or more functionality and the second integrated circuit comprises second portion of first circuitry.

14. The method of claim 8, wherein first dicing channel is etched using at least one of an RIE, wet etch, or Ion Mills process.

15. A three dimensional (3D) integrated circuit, comprising:
a first integrated circuit (IC) having a first surface and a first via extending to the first surface;
a second integrated circuit having a second surface and a second via directly and physically contacting an overlying bond pad that extends from the second surface, wherein the first via is soldered to the bond pad, and wherein the first surface is in a facing relationship with the second surface;
a first crack stop or moisture barrier formed in the first integrated circuit that extends to the first surface;
a second crack stop or moisture barrier formed in the second integrated circuit that extends to the second surface;
an adhesive material overlying the first crack stop or moisture barrier and underlying the second crack stop or moisture barrier; and
a solder joint joining the first via to the bond pad, wherein there is a gap between the solder joint and the adhesive material.

16. The 3D integrated circuit of claim 15, wherein the first IC is made of a first semiconductor material and the second IC is made of a second semiconductor device material different from the first semiconductor material.

17. The 3D integrated circuit of claim 16, wherein the first semiconductor material is silicon and the second semiconductor material is a III-V semiconductor material.

18. The 3D integrated circuit of claim 15, wherein the first IC comprises first circuitry of a first one or more functionality and the second IC comprises second circuitry of a second one or more functionality different from the first one or more functionality.

19. The 3D integrated circuit of claim 18, wherein the first circuitry is device logic and the second circuitry is optoelectronic circuitry or input/output circuitry.

20. The 3D integrated circuit of claim 15, wherein the first IC comprises a first portion of first circuitry of a first one or more functionality and the second IC comprises second portion of the first circuitry.

21. The 3D integrated circuit of claim 15, further comprising one or more dicing channels etched in the first IC.

22. The 3D integrated circuit of claim 21, wherein the adhesive material bonds the first IC to the second IC and overlays the one or more dicing channels of the first IC and underlying one or more dicing channels of the second IC aligned with the one or more dicing channels of the first IC.

* * * * *